(12) United States Patent
Lin et al.

(10) Patent No.: US 6,836,166 B2
(45) Date of Patent: Dec. 28, 2004

(54) METHOD AND SYSTEM FOR DELAY CONTROL IN SYNCHRONIZATION CIRCUITS

(75) Inventors: Feng Lin, Boise, ID (US); Brent Keeth, Boise, ID (US); Brian Johnson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/339,752

(22) Filed: Jan. 8, 2003

(65) Prior Publication Data

US 2004/0130366 A1 Jul. 8, 2004

(51) Int. Cl.[7] .................................................. H03L 7/06
(52) U.S. Cl. ........................ 327/158; 327/161; 327/276; 327/299
(58) Field of Search ................................. 327/158, 159, 327/161, 276, 277, 278, 299; 331/1 A, 40, 177 R

(56) References Cited

U.S. PATENT DOCUMENTS

| | | | |
|---|---|---|---|
| 3,788,572 A | 1/1974 | Wroblewski | 242/332.1 |
| 4,165,490 A | * 8/1979 | Howe et al. | 327/172 |
| 5,109,394 A | 4/1992 | Hjerpe et al. | 375/119 |
| 5,192,886 A | 3/1993 | Wetlaufer | 327/158 |
| 5,198,758 A | 3/1993 | Iknaian et al. | 324/158 R |
| 5,272,390 A | 12/1993 | Watson, Jr. et al. | 327/149 |
| 5,369,640 A | 11/1994 | Watson et al. | 371/1 |
| 5,420,531 A | 5/1995 | Wetlaufer | 327/270 |
| 5,544,203 A | 8/1996 | Casasanta et al. | 375/376 |
| 5,552,726 A | 9/1996 | Wichman et al. | 327/149 |
| 5,604,775 A | 2/1997 | Saitoh et al. | 375/376 |
| 5,638,010 A | 6/1997 | Adams | 327/105 |
| 5,723,907 A | 3/1998 | Akram | 257/723 |
| 5,729,049 A | 3/1998 | Corisis et al. | 257/666 |
| 5,774,403 A | 6/1998 | Clark, II et al. | 365/194 |
| 5,790,612 A | 8/1998 | Chengson et al. | 375/373 |
| 5,808,478 A | 9/1998 | Andresen | 326/31 |
| 5,844,954 A | 12/1998 | Casasanta et al. | 375/373 |
| 5,854,797 A | 12/1998 | Schwartz et al. | 371/22.1 |
| 5,870,003 A | 2/1999 | Boerstler | 331/17 |
| 5,923,715 A | 7/1999 | Ono | 375/376 |
| 6,011,732 A | 1/2000 | Harrison et al. | 365/194 |
| 6,012,502 A | 1/2000 | VanNortwick et al. | 156/518 |
| 6,013,535 A | 1/2000 | Moden et al. | 438/15 |
| 6,016,004 A | 1/2000 | Schrock | 257/676 |
| 6,025,212 A | 2/2000 | VanNortwick et al. | 438/111 |
| 6,047,346 A | 4/2000 | Lau et al. | 710/126 |
| 6,051,449 A | 4/2000 | Schrock | 438/118 |

(List continued on next page.)

FOREIGN PATENT DOCUMENTS

JP    10190423 A    7/1998

Primary Examiner—Timothy P. Callahan
Assistant Examiner—An T. Luu
(74) Attorney, Agent, or Firm—Dorsey & Whitney LLP

(57) ABSTRACT

A synchronization circuit includes a first and second phase-shifting path circuit, with each generates a phase-shifted signal responsive to an input signal and the phase-shifted signal having respective fine and coarse phase shifts relative to the input signal. Each phase-shifting path circuit adjusts the coarse and fine phase shifts responsive to control signals. A selection circuit outputs one of the phase-shifted signals responsive to a selection signal. A control circuit monitors a phase shift between the input signal and the output phase-shifted signal and develops the selection and control signals to select one of the phase-shifting path circuits and to adjust the fine phase shift of the selected path circuit and the fine and coarse phase shifts of the other path circuit. When the fine delay of the selected phase-shifting path circuit has a threshold value, the control circuit develops the selection signal to select the other phase-shifting circuit.

54 Claims, 4 Drawing Sheets

U.S. PATENT DOCUMENTS

| | | | |
|---|---|---|---|
| 6,080,263 A | 6/2000 | Saito et al. | 156/253 |
| 6,094,082 A | 7/2000 | Gaudet | 327/270 |
| 6,101,197 A | 8/2000 | Keeth et al. | 370/517 |
| 6,121,808 A | 9/2000 | Gaudet | 327/231 |
| 6,131,168 A | 10/2000 | Krzyzkowski | 713/503 |
| 6,163,174 A | 12/2000 | Friedman et al. | 326/108 |
| 6,204,732 B1 | 3/2001 | Rapoport et al. | 331/2 |
| 6,212,126 B1 | 4/2001 | Sakamoto | 365/233 |
| 6,265,916 B1 | 7/2001 | Ono et al. | 327/116 |
| 6,268,753 B1 | 7/2001 | Sandusky | 327/266 |
| 6,285,172 B1 | 9/2001 | Torbey | 323/237 |
| 6,301,121 B1 | 10/2001 | Lin | 361/783 |
| 6,340,525 B1 | 1/2002 | Akamatsu et al. | 428/364 |
| 6,423,407 B1 | 7/2002 | Abe et al. | 428/364 |
| 6,445,231 B1 | 9/2002 | Baker et al. | 327/158 |
| 6,462,623 B1 | 10/2002 | Horan et al. | 331/17 |
| 6,480,047 B2 | 11/2002 | Abdel-Maguid et al. | 327/161 |
| 6,489,218 B1 | 12/2002 | Kim et al. | 438/460 |
| 6,518,812 B1 * | 2/2003 | Sikkink et al. | 327/284 |
| 6,543,510 B1 | 4/2003 | Prindiville | 156/517 |

* cited by examiner (12)# METHOD AND SYSTEM FOR DELAY CONTROL IN SYNCHRONIZATION CIRCUITS

TECHNICAL FIELD

The present invention relates generally to integrated circuits, and more specifically to synchronizing signals in integrated circuits.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs, and include other types of integrated circuits as well, such as microprocessors. The timing of signals external to a synchronous memory device is determined by the external clock signal, and operations within the memory device typically must be synchronized to external operations. For example, data words must be placed on a data bus of the memory device in synchronism (i.e. edge aligned) with the external clock signal, enabling a memory controller to latch these data words at the proper times to successfully capture the data words. To properly output the data words, the memory device develops an internal clock signal in response to the external clock signal, and this internal clock signal is typically applied to output buffers contained in the memory device to thereby clock the data words onto the data bus at the proper times. The data words and the external clock signal must be synchronized to ensure the memory controller latches the data words at the proper times to successfully capture the data words.

In the present description, "external" is used to refer to signals and operations outside of the memory device and controller, while "internal" refers to signals and operations within the memory device controller. Moreover, although the present description is directed to synchronous memory devices, the principles described herein are equally applicable to other types of synchronous integrated circuits.

To synchronize external and internal clock signals in modern synchronous memory devices, a number of different approaches have been considered and utilized, including delay-locked loops (DLLs), phased-locked loops (PLLs), and synchronous mirror delays (SMDs), as will be appreciated by those skilled in the art. As used herein, the term synchronized includes signals that are coincident and signals that have a desired delay relative to one another. FIG. 1 is a functional block diagram illustrating a conventional delay-locked loop 100 including a coarse variable delay line 102 that receives a clock buffer signal CLKBUF and generates a coarse delayed clock signal CDCLK in response to the clock buffer signal. The coarse variable delay line 102 controls a coarse variable delay CD of the CDCLK signal relative to the CLKBUF signal responsive to a coarse delay adjustment signal CDADJ. A fine variable delay line 103 receives the CDCLK signal and generates a delayed clock signal CLKDEL in response to the CDCLK signal, with the CLKDEL signal having a fine variable delay FD relative to the CDCLK signal. The fine variable delay line 103 controls the value of the fine variable delay FD in response to a fine delay adjustment signal FDADJ.

A feedback delay line 104 generates a feedback clock signal CLKFB in response to the CLKDEL signal, the feedback clock signal having a model delay D1+D2 relative to the CLKDEL signal. The D1 component of the model delay D1+D2 corresponds to a delay introduced by an input buffer 106 that generates the CLKBUF signal in response to an external clock signal CLK, while the D2 component of the model delay corresponds to a delay introduced by an output buffer 108 that generates a synchronized clock signal CLKSYNC in response to the CLKDEL signal. Although the input buffer 106 and output buffer 108 are illustrated as single components, each represents all components and the associated delay between the input and output of the delay-locked loop 100. The input buffer 106 thus represents the delay D1 of all components between an input that receives the CLK signal and the input to the variable delay line 102, and the output buffer 108 represents the delay D2 of all components between the output of the variable delay line and an output at which the CLKSYNC signal is developed.

The delay-locked loop 100 further includes a phase detector and controller 110 that receives the CLKFB and CLKBUF signals and generates the coarse delay adjustment signal CDADJ applied to the coarse variable delay line 102 and the fine delay adjustment signal FDADJ applied to the fine variable delay line 103 in response to the phase shift between the CLKFB and CLKBUF signals. One implementation of the phase detector and controller 110 is described in U.S. Pat. No. 5,946,244 to Manning (Manning), which is assigned to the assignee of the present patent application and which is incorporated herein by reference. The phase detector and controller 110 adjusts the coarse and fine variable delays CD, FD as a function of the detected phase between the CLKBUF and CLKFB signals to thereby control an overall variable delay VD of the delay-locked loop 100, where VD=CD+FD.

In operation, the phase detector and controller 110 detects the phase difference between the CLKBUF and CLKFB signals, and generates the CDADJ, FDADJ signals to adjust the variable delay VD of the CLKDEL signal until the phase difference between the CLKBUF and CLKFB signals is approximately zero. More specifically, as the variable delay VD of the CLKDEL signal is adjusted, the phase of the CLKFB signal from the feedback delay line 104 is adjusted until the CLKFB signal has approximately the same phase as the CLKBUF signal. When the delay-locked loop 100 has adjusted the variable delay VD to a value causing the phase shift between the CLKBUF and CLKFB signals to equal approximately zero, the delay-locked loop is said to be "locked." When the delay-locked loop 100 is locked, the CLK and CLKSYNC signals are synchronized. This is true because when the phase shift between the CLKBUF and CLKFB signals is approximately zero (i.e., the delay-locked loop 100 is locked), the variable delay VD has a value of NTCK−(D1+D2) as indicated in FIG. 1, where N is an integer and TCK is the period of the CLK signal. When VD equals NTCK−(D1+D2), the total delay of the CLK signal through the input buffer 106, variable delay line 102, and output buffer 108 is D1+NTCK−(D1+D2)+D2, which equals NTCK. Thus, the CLKSYNC signal is delayed by NTCK relative to the CLK signal and the two signals are synchronized since the delay is an integer multiple of the period of the CLK signal. Referring back to the discussion of synchronous memory devices above, the CLK signal corresponds to the external clock signal and the CLKDEL signal corresponds to the internal clock signal.

In the delay-locked loop 100, the coarse and fine variable delay lines 102, 103 are typically formed from a number of serially-connected individual unit delay stages 112, 114 as illustrated, with individual unit delay stages being added or removed to adjust the variable delay CD, FD as required, as will be understood by those skilled in the art. Each unit delay stage 112 in the coarse variable delay line 102 introduces a coarse unit time delay TCD while each unit delay stage 114 in the fine variable delay line 103 introduces a fine unit time delay TFD, where TCD=N×TFD for some integer N. Typically, the total number of unit delay stages in the fine variable delay line 103 is such that the fine delay FD has a maximum value that is just less than the value of a coarse unit time delay TCD. For example, if TCD=6×TFD then the fine variable delay line 103 may include 5 unit delay stages so the maximum value of the fine delay FD is 5TFD. The overall variable delay of the delay lines 102, 103 is VD=P×TCD+Q×TFD, and is adjusted in increments of TCD by the coarse variable delay line and in smaller increments of TFD by the fine variable delay line. For example, to adjust the delay CD of the coarse variable delay line 102 the CLKBUF signal is alternately applied to an input I1–I3 of the serially-connected unit delay stages 112 responsive to the CDADJ signal. Similarly, to adjust the delay FD of the fine variable delay line 103 the CDCLK signal is alternately applied to an input I1–I6 of the serially-connected unit delay stages 114 responsive to the FDADJ signal.

After the delay-locked loop 100 is initially locked, the overall variable delay VD may need to be adjusted to compensate for variations in the applied CLK signal or variations in the operation of the input buffer 106 or delay lines 102, 103 as a function of applied supply voltage (not shown) or temperature. As long as the variations of the CLK signal and operation of the components 102, 103, 106 are relatively small, the overall variable delay VD may be adjusted by varying only the value of the fine delay FD, while the coarse delay CD remains unchanged. For relatively large voltage or temperature changes, however, the resulting variations in the CLK signal and operation of components 102, 103, 106 necessitate the adjustment of the coarse delay CD to once again lock the delay-locked loop 100.

In changing the coarse delay CD, the number of coarse unit delay stages 112 delaying the applied CLKBUF signal is varied by switching one of the unit delay stages into or out of the path of the CLKBUF signal. Such switching of coarse unit delays 112 into or out of the signal path of the CLKBUF signal can result in "edge perturbations" or "jittter" of the edge of the CLKBUF signal propagating through the delay line 102, which can result in the delay-locked loop 100 no longer being locked, as will be appreciated by those skilled in the art. For example, assume TCD=200 ps and TFD=30 ps, and assume the fine delay FD of the fine variable delay line 103 is currently 180 ps. At this point, no more fine unit delay stages 114 can be added to increase the delay, so a coarse unit delay TCD is added to the coarse delay CD and the fine delay is reset to a value of 90 ps (i.e., input to 14 as show in FIG. 1). In making this adjustment, the net change in the overall variable delay VD is 200 ps added to the coarse delay CD and 90 ps subtracted from the fine delay FD for a net adjustment to the variable delay VD of 110 ps.

At high frequencies of the applied CLK signal, the period TCK of the CLK signal is small and a small net change of, for example, 110 ps in the overall delay VD can result in an edge perturbation causing the delay-locked loop 100 to lose its lock, as will be appreciated by those skilled in the art. When the delay-locked loop 100 is not locked, the generated CLKSYNC signal is not synchronized with the CLK signal, and thus timing failures may result in circuitry performing operation responsive to the CLKSYNC signal. Moreover, because the delay-locked loop 100 takes a relatively long to time to lock (e.g., approximately 200 cycles of the CLK signal), circuitry operating responsive to the CLKSYNC signal must wait a correspondingly long time before commencing operation again to ensure proper timing relative to the CLK signal.

There is a need for a delay-locked loop that locks an applied clock signal over a wide range of voltage, temperature, and other operating parameters that can affect the operation of the delay-locked loop.

SUMMARY OF THE INVENTION

According to one aspect of the present invention, a synchronization circuit includes a first phase-shifting path circuit that receives an input signal and generates a first phase-shifted signal responsive to the input signal. The first phase-shifted signal has a fine phase shift and a coarse phase shift relative to the input signal, and the first phase-shifting path circuit adjusts the coarse and fine phase shifts responsive to coarse and fine control signals, respectively. A second phase-shifting path circuit receives the input signal and generates a second phase-shifted signal responsive to the input signal. The second phase-shifted signal has a fine phase shift and a coarse phase shift relative to the input signal, and the second phase-shifting path circuit adjusts the coarse and fine phase shifts responsive to coarse and fine control signals, respectively. A selection circuit is coupled to the first and second phase-shifting path circuits and selects one of the first and second phase-shifted signals responsive to a selection signal and applies the selected signal on an output.

A control circuit receives the input signal and develops the selection signal to select one of the first and second phase-shifted signals. In response to a phase shift between the input signal and the selected phase-shifted signal, the control circuit applies the fine control signals to adjust the fine phase shift of the phase-shifting path circuit generating the selected phase-shifted signal and applies the fine and coarse control signals to adjust the fine and coarse phase shifts of the other phase-shifting path circuit. In response to the fine delay of the phase-shifting path circuit that is generating the selected phase-shifted signal having a threshold value, the control circuit develops the selection signal to select the other one of the phase-shifted signals.

DETAILED DESCRIPTION OF THE INVENTION

Figure 2:
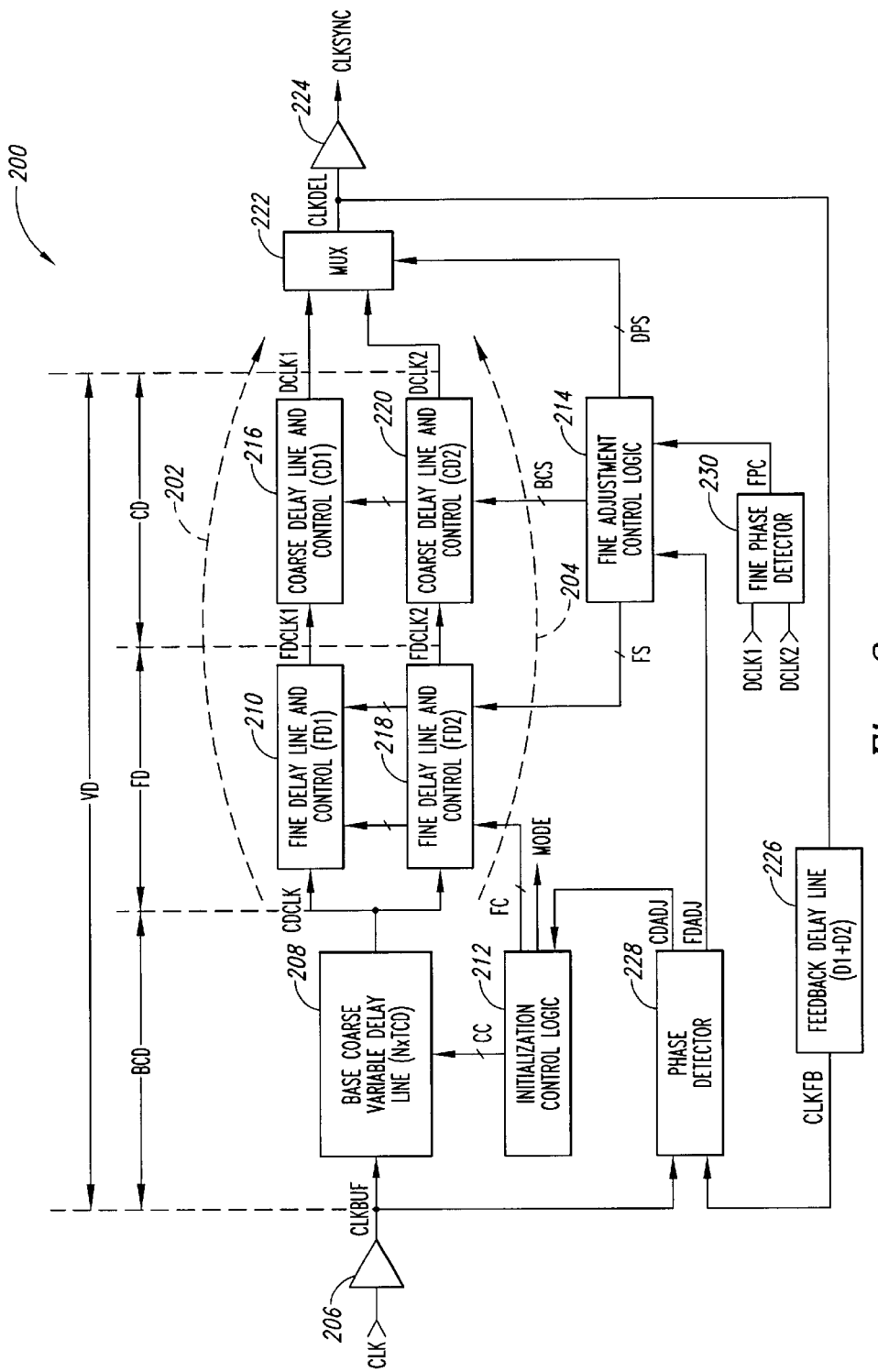
FIG. 2 is a functional block diagram of a delay-locked loop including dual delay paths according to one embodiment of the present invention.

FIG. 2 is a functional block diagram of a delay-locked loop 200 including dual delay paths 202, 204 that operate in parallel to allow a fine delay FD and a coarse delay CD to be adjusted without causing edge perturbations that may result in the delay-locked loop losing its lock, as will be explained in more detail below. Briefly, one of the delay paths 202, 204 operates as an "active" delay path in which only adjustments to the fine delay FD are made during operation of the delay-locked loop 200. The other one of the delay paths 202, 204 operates as a "background" delay path in which adjustments to both the fine and coarse delays FD, CD are made during operation of the delay-locked loop 200. When the fine delay FD in the active delay path 202, 204 approaches a maximum or minimum value, the operation of the delay paths is switched, with the active delay path becoming the background delay path and the background delay path becoming the active delay path. The active and background delay paths 202, 204 then operate as just described, with coarse and fine delays CD, FD being adjusted in the background path and only the fine delay FD being adjusted in the active path. In this way, the value of the coarse delay CD is adjusted as required in the background path and causes no edge perturbations that may cause the delay-locked loop 200 to lose its lock.

In the following description, certain details are set forth to provide a sufficient understanding of the present invention, but one skilled in the art will appreciate that the invention may be practiced without these particular details. Furthermore, one skilled in the art will appreciate that the example embodiments described below do not limit the scope of the present invention, and will also understand various modifications, equivalents, and combinations of the disclosed example embodiments and components of such embodiments are within the scope of the present invention. Illustrations of the various embodiments, when presented by way of illustrative examples, are intended only to further illustrate certain details of the various embodiments, and should not be interpreted as limiting the scope of the present invention. Finally, in other instances below, the operation of well known components has not been shown or described in detail to avoid unnecessarily obscuring the present invention.

In the delay-locked loop 200, a clock signal CLK is applied through an input buffer 206 to generate a buffered clock signal CLKBUF. A base coarse variable delay line 208 receives the CLKBUF signal and generates a coarse delayed clock signal CDCLK having a base coarse delay BCD relative to the CLKBUF signal. The CDCLK signal is applied through the delay paths 202 and 204 to generate a first delayed clock signal DCLK1 and a second delayed clock signal DCLK2, respectively. More specifically, the delay path 202 includes a first fine delay line and control circuit 210 that receives the CDCLK signal and generates a first fine delayed clock signal FDCLK1 having a first fine delay FD1 relative to the CDCLK signal responsive to the fine control signals FC from initialization control logic 212 during an initialization mode of operation and responsive to fine shift signals FS from fine adjustment control logic 214 during a normal mode of operation. The operation of the initialization control logic 212 and fine adjustment control logic 214 will be described in more detail below. A first coarse delay line and control circuit 216 receives the FDCLK1 signal from the fine delay line and control circuit 210 and generates a first delayed clock signal DCLK1 having a first coarse delay CD1 relative to the FDCLK1 signal responsive to background coarse shift signals BCS from the fine adjustment control logic 214.

Figure 1:
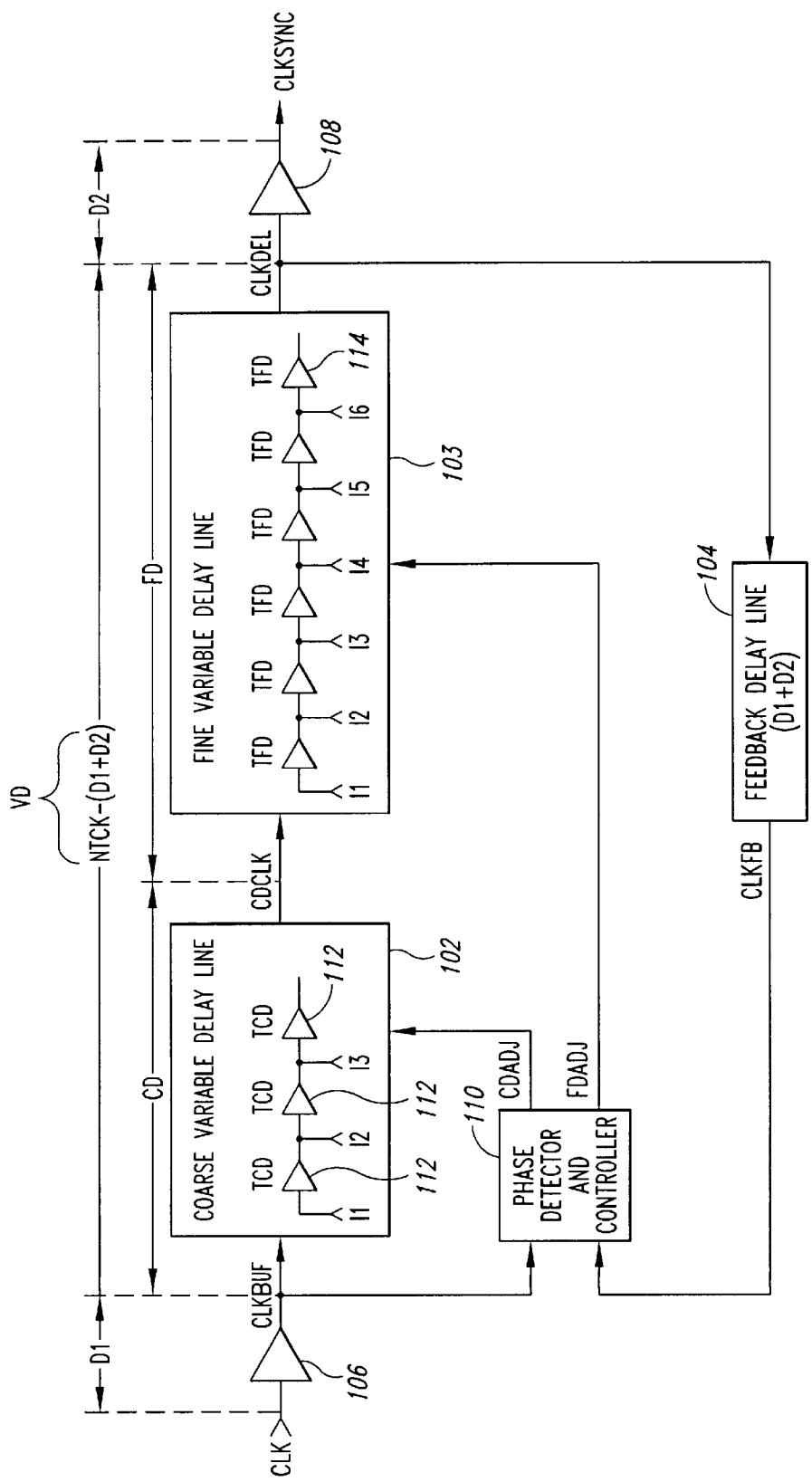
FIG. 1 is a functional block diagram of a conventional delay-locked loop.

Similarly, the delay path 204 includes a second fine delay line and control circuit 218 that receives the CDCLK signal and generates a second fine delayed clock signal FDCLK2 having a second fine delay FD2 relative to the CDCLK signal responsive to the FC signals from the initialization control logic 212 during the initialization mode and FS signals from the fine adjustment control logic 214 during the normal mode. A second coarse delay line and control circuit 220 receives the FDCLK2 signal from the fine delay line and control circuit 218 and generates a second delayed clock signal DCLK2 having a second coarse delay CD2 relative to the FDCLK2 signal responsive to the BCS signals from the fine adjustment control logic 214. Each of the first and second fine delay line and control circuits 210, 218 includes a plurality of series-connected fine unit delay stages (not shown) that each provides a fine unit time delay TFD, as previously discussed with reference to the fine variable delay line 103 of FIG. 1. Similarly, each of the first and second coarse delay line and control circuits 216, 220 includes a plurality of series connected coarse unit delay stages (not shown) that each provides a coarse unit time delay TCD, as previously discussed with reference to the coarse variable delay line 102 of FIG. 1.

A multiplexer 222 receives the DCLK1 and DCLK2 signals from the coarse delay line and control circuits 216 and 220, respectively, and outputs a selected one of these signals as a delayed clock signal CLKDEL in response to a delay path selection signal DPS from the fine adjustment control logic 214. When the DPS signal is active, the multiplexer 222 provides the DCLK1 signal as the CLKDEL signal, and when the DPS signal is inactive the multiplexer provides the DCLK2 signal as the CLKDEL signal signal. An output buffer 224 generates a synchronized clock signal CLKSYNC in response to the CLKDEL signal. A feedback delay line 226 generates a feedback clock signal CLKFB in response to the CLKDEL signal, with the feedback clock signal having a model delay D1+D2 relative to the CLKDEL signal as previously described for the feedback delay line 104 of FIG. 1. A phase detector 228 receives the CLKFB and CLKBUF signals and generates a coarse delay adjustment signal CDADJ and a fine delay adjustment signal FDADJ in response to the a shift between the CLKFB and CLKBUF signals. During the initialization mode of operation, the initialization control logic 212 operates in response to the CDADJ signal from a phase detector 228 to generate the CC signals to adjust the base coarse delay BCD of the delay line 208 and the FC signals to adjust the fine delays FD1 and FD2 of the fine delay line and control circuits 210 and 218, respectively.

The initialization control logic 212 also develops a mode signal MODE that is activated to place the delay-locked loop 200 into the normal mode and is deactivated to place the delay-locked loop into the initialization mode. When the MODE signal is active, the fine adjustment control logic 214 operates responsive to the FDADJ signal from the phase detector 228 to generate the FS signals, and applies the FS signals to the fine delay line and control circuits 210, 218 to adjust the fine delays FD1, FD2. The fine adjustment control logic 214 also develops the BCS signals to adjust the coarse delay CD1 or CD2 of the coarse delay line and control circuit 216 or 220 in the background delay path 202 or 204. The coarse delay CD1, CD2 of the circuit 216, 220 in the active delay path 202, 204, is not adjusted during the normal mode. When the MODE signal is inactive, which is during the initialization mode, the fine adjustment control logic 214 does not develop the FS and BCS signals but instead only activates or deactives the DPS signal to select one of the delay paths 202, 204 as the active delay path. If the delay path 202 is to be selected as the active path during the initialization mode, the fine adjustment control logic 214 applies an active DPS signal to the multiplexer 222 which, in turn, provides the DCLK1 signal as the CLKDEL signal. Conversely, if the delay path 204 is to be selected as the active path during the initialization mode, the fine adjustment control logic 214 applies an inactive DPS signal to the multiplexer 222 which, in turn, provides the DCLK2 signal as the CLKDEL signal.

The delay locked loop 200 further includes a fine phase detector 230 that receives the DCLK1, DCLK2 signals from the coarse delay and control lines 216, 220, and develops a fine phase control signal FDC responsive to any phase shift between the DCLK1 and DCLK2 signals. The FDC signal is applied to the fine adjustment control logic 214, which adjusts the fine delays FDC, FD2 in the background and active delay paths 202, 204 as required to eliminate or reduce the phase shift between the DCLK1 and DCLK2 signals. A phase shift between the DCLK1 and DCLK2 signals can result from variations in the individual unit delay stages forming the circuits 210, 216, 218, 220, which can cause a slight delay offset (i.e., FD1+CD1 does not equal FD2+CD2) and hence a phase shift between the active and background delay paths 202, 204, as will be appreciated by those skilled in the art. The fine phase detector 230 can be included in the delay-locked loop 200 to compensate for any such delay offset so that the DCLK1 and DCLK2 signals are synchronized.

Now that each of the components 202–228 in the delay-locked loop 200 has been described, the overall operation of the delay-locked loop will be described in more detail. To generate the CLKSYNC signal that is synchronized with the CLK signal, the delay-locked loop 200 initially operates in the initialization mode. During the initialization mode, the initialization control logic 212 deactivates the MODE signal, causing the fine adjustment control logic 214 to generate the DPS signal that causes the multiplexer 222 to output the DCLK1, DCLK2 signal from the active delay path. Further in response to the inactive MODE signal, the fine adjustment control logic 214 does not generate the FS and BCS signals to adjust the respective delays of the circuits 210, 216, 218, 220. In the following description, the initialization control logic 212 selects the delay path 202 as the active path during the initialization mode. Thus, to select the delay path 202, the initialization control logic 212 activates the MODE signal and the fine adjustment control logic 214, responsive to the active MODE signal, activates the DPS signal. In response to the active DPS signal, the multiplexer 222 outputs the DCLK1 signal from the delay path 202 as the CLKDEL signal. The coarse delays CD1, CD2 of the coarse delay line and control circuits 216, 220 are set to initial values and are not adjusted during the initialization mode. Since the delay path 202 is the active delay path, the delay path 204 is initially the background delay path.

At this point, the CLKDEL signal is applied through the feedback delay line 226 to generate the CLKBUF signal, and the phase detector 228 detects the phase shift between the CLKBUF and CLKFB signals and develops the CDADJ signal responsive to the detected phase shift. In response to the CDADJ signal, the initialization control circuit 212 generates the CC signals to adjust the base coarse delay BCD of the variable delay line 208 and also generates the FC signals to adjust the fine delay FD1 of the fine delay line control circuit 210 in the active delay path 202. The delay-locked loop 200 continues operating in this manner, with the initialization control logic 212 and phase detector 222 operating in combination to adjust the base coarse delay BCD and fine delay FD1 until the phase shift between the CLKBUF and CLKFB signals is approximately zero.

Once the detected phase shift between the CLKBUF and CLKFB signals is approximately zero, the initialization control logic 212 activates MODE signal to place the delay-locked loop 200 into the normal mode of operation. At this point, the initialization control logic 212 also terminates generation of the CC and FC signals. When the MODE signal goes active, the fine adjustment control logic 214 begins developing the FS signals and BCS signals responsive to the FDADJ signal from the phase detector 228. The fine adjustment control logic 214 applies the FS signals to the fine delay line and control circuit 210, 218 in the active delay path 202, 204, which at this point is the fine delay line and control circuit 210 in the active delay path 202. Thus, the fine adjustment control logic 214 applies the FS signals to the fine delay line control circuit 210 to adjust the fine delay FD1 as required to maintain approximately zero phase shift between the CLKBUF and CLKFB signals, meaning the CLKDEL signal has the required delay to synchronize the CLK and CLKSYNC signals so that the delay-locked loop 200 is locked.

In addition to developing the FS signals to adjust fine delay FD1 in the active delay path 202, the fine adjustment control logic 214 also monitors the value of the fine delay FD1 and adjusts both the fine delay FD2 of the fine delay line and control circuit 218 and the coarse delay CD2 of the coarse delay line and control circuit 220 in the background delay path 204. In this way, the fine adjustment control logic 214 adjusts both fine delay FD2 and coarse delay CD2 in the background delay path 204 while the coarse delay CD1 in the active delay path 202 is not adjusted. The values of the fine delay FD2 and coarse delay CD2 are adjusted so that the sum of these two delays is equal to the sum of the delays FD1 and CD1 in the active delay path 202 (FD2+CD2= FD1+CD1).

The fine adjustment control logic 214 continues operating in this manner, adjusting the fine delay FD1 in the active delay path 202 and the fine delay FD2 and coarse delay CD2 in the background delay path 204, until the fine delay FD1 approaches a minimum or maximum value. When the fine adjustment control logic 214 determines the fine delay FD1 in the active delay path 202 has a maximum or minimum value, the control logic reverses the operation of the delay paths, making the delay path 204 the active delay path and the delay path 202 the background delay path. More specifically, the fine adjustment control logic 214 drives the DPS signal inactive, causing the multiplexer 222 to output the DCLK2 signal from the delay path 204 as the CLKDEL signal instead of the DCLK1 signal. At this point, the delay path 204 is the active delay path and delay path 202 is the background delay path. The fine adjustment control logic 214 thereafter operates as previously described to adjust the fine delay FD2 in the active delay path 204 and to adjust both the fine delay FD1 and coarse delay CD1 in the background delay path 202. Once again, the coarse delay CD2 in the active delay path 204 is not adjusted but is maintained constant as long as the delay path 204 is the active delay path while the both the fine delay FD1 and coarse delay CD1 are adjusted to keep FD1+CD1=FD2+CD2.

The fine adjustment control logic 214 continues reversing the operation of the active and background delay paths 202, 204 each time the fine delay FD1 or FD2 in the active delay path reaches a maximum or minimum value, and adjusting both the fine delay FD1, FD2 and coarse delay CD1, CD2 in the background delay path. In this way, the total delay provided by each of the delay paths 202, 204 is adjusted in coarse delay increments TCD only in the background delay path, eliminating the switching of coarse unit delay stages (see FIG. 1) into or out of the active delay path to thereby eliminate any edge perturbations of the CLKBUF signal propagating through the active delay path which may be caused by such switching, as previously discussed with reference to FIG. 1. Thus, the delay-locked loop 200 provides for adjustment of the overall variable delay VD (see FIG. 2) in coarse delay increments TCD without the risk of timing failures of the delay-locked loop that may arise from edge perturbations caused by such coarse delay adjustments. The delay-locked loop 200 can thus generate the synchronized CLKSYNC signal over a wide range of supply voltage and temperature variations without the concern for timing failures that may arise in the conventional delay-locked loop 100 for such variations in supply voltage and temperature. While the delay-locked loop 200 requires some additional circuitry to provide for the dual delay paths 202, 204, in contrast to the single delay path of the conventional delay-locked loop 100 of FIG. 1, the more reliable performance over relatively wide variations in supply voltage and temperature will be worth the additional circuitry in many applications.

In the delay-locked loop 200, the maximum value of the coarse delays CD1, CD2 are selected to provide the required delay to compensate for deviations in the operation of components in the delay-locked loop due to anticipated variations in supply voltage and temperature. Moreover, each fine delay line and control circuit 210, 218 would typically provide for a maximum delay that is slightly greater than one coarse unit time delay TCD. For example, if TCD=6TFD, then each fine delay line and control circuit 210, 218 may include 8 unit fine delay stages to provide for a maximum fine delays FD1, FD2 of TCD+2TFD. By providing a fine delay FD1, FD2 range that is slightly greater than one coarse unit time delay TCD, the background delay path 202, 204 can track the exact delay being provide by the active delay path so that there is no deviation in the overall delay when switching between the active and background delay paths. As long as at least one of fine delays FD1, FD2 has a range greater than one coarse unit time delay TCD, tracking between the active and background delay paths 202, 204 is possible. For example, in one embodiment, TCD=6TFD and the fine delay line and control circuits 210 and 218 include 8 and 2 unit fine delay stages, respectively, while the coarse delay line and control circuits 216 and 220 include 3 and 4 unit coarse delay stages, respectively.

Although the delay-locked loop 200 of FIG. 2 is the embodiment of the present invention described herein, one skilled in the art will realize other embodiments of the invention are within the scope of the present invention. For example, other synchronization circuits, such as a phase-locked loop, may be formed including dual delay paths that operate analogous to the delays paths 202, 204 of FIG. 2 according to other embodiments of the present invention. Various modifications and equivalents of the disclosed example embodiment and components therein are within the scope of the present invention. One skilled in the art will also realize that the term "delay" as used herein includes a delay of one signal relative to another as well as a lead in time of that one signal relative to the other signal, and thus may be viewed as a phase shift between the signals, which includes both a leading and lagging relationship between the signals includes a delay as the functions performed by the various blocks or components 202–228 forming the delay-locked loop 200 may be grouped differently than shown in FIG. 2. For example, a single phase detector and controller block could be illustrated and function to detect the phase difference between the CLKBUF and CLKFB signals and control the components 208–210 and 216–222.

Figure 3:
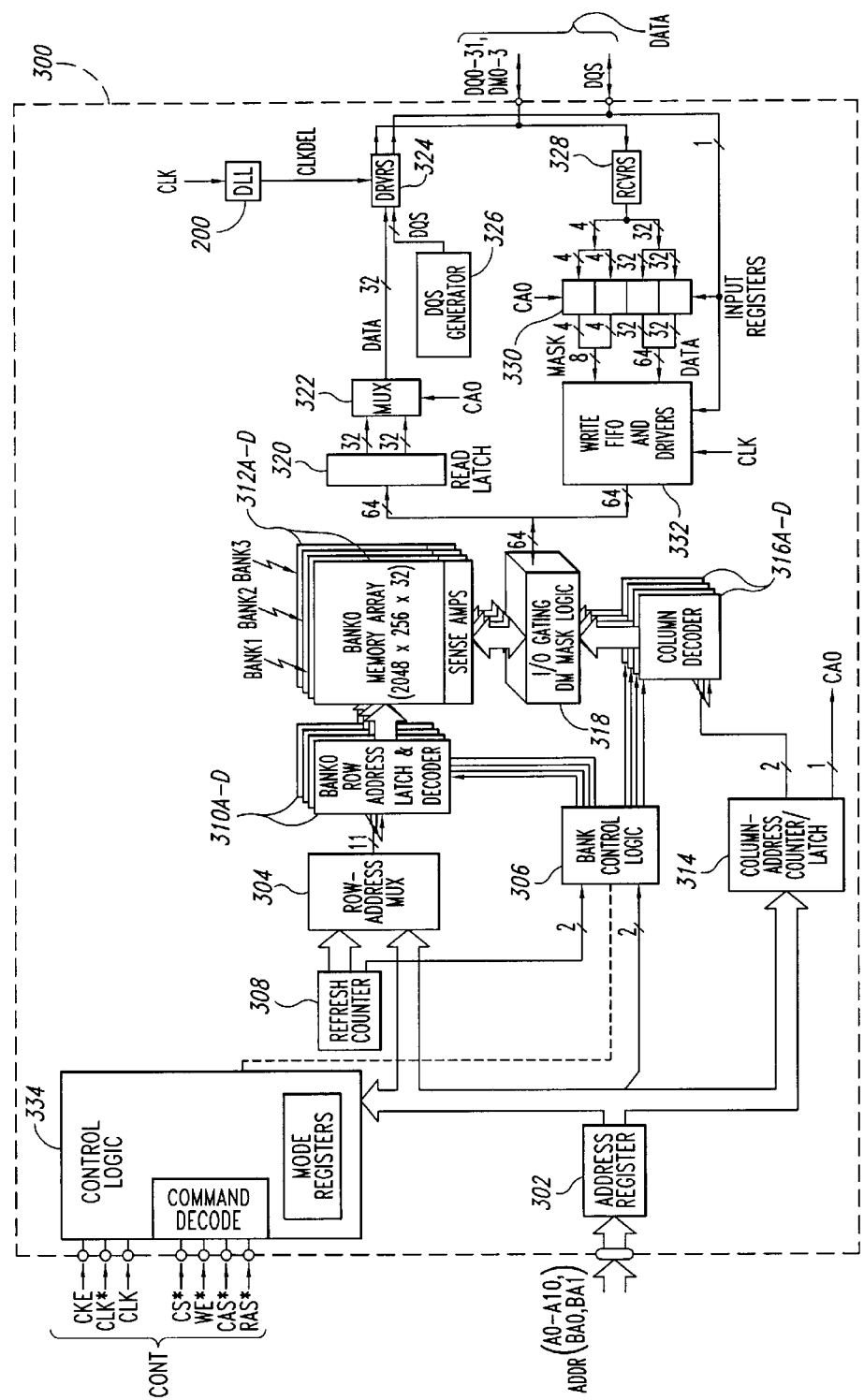
FIG. 3 is a functional block diagram of a memory device including the delay-locked loop of FIG. 2.

FIG. 3 is a functional block diagram of a memory device 300 including the delay-locked loop 200 of FIG. 2. The memory device 300 in FIG. 3 is a double-data rate (DDR) synchronous dynamic random access memory ("SDRAM"), although the principles described herein are applicable to any memory device that may include a delay-locked loop or other synchronization circuit for synchronizing signals, such as conventional synchronous DRAMs (SDRAMs) and packetized memory devices like SLDRAMs. The principles are equally applicable to any integrated circuit that must synchronize signals such as internal and external clocking signals.

The memory device 300 includes an address register 302 that receives row, column, and bank addresses over an address bus ADDR, with a memory controller (not shown) typically supplying the addresses. The address register 302 receives a row address and a bank address that are applied to a row address multiplexer 304 and bank control logic circuit 306, respectively. The row address multiplexer 304 applies either the row address received from the address register 302 or a refresh row address from a refresh counter 308 to a plurality of row address latch and decoders 310A–D. The bank control logic 306 activates the row address latch and decoder 310A–D corresponding to either the bank address received from the address register 302 or a refresh bank address from the refresh counter 308, and the activated row address latch and decoder latches and decodes the received row address. In response to the decoded row address, the activated row address latch and decoder 310A–D applies various signals to a corresponding memory bank 312A–D to thereby activate a row of memory cells corresponding to the decoded row address. Each memory bank 312A–D includes a memory-cell array having a plurality of memory cells arranged in rows and columns, and the data stored in the memory cells in the activated row is stored in sense amplifiers in the corresponding memory bank. The row address multiplexer 304 applies the refresh row address from the refresh counter 308 to the decoders 310A–D and the bank control logic circuit 306 uses the refresh bank address from the refresh counter when the memory device 300 operates in an auto-refresh or self-refresh mode of operation in response to an auto- or self-refresh command being applied to the memory device 300, as will be appreciated by those skilled in the art.

A column address is applied on the ADDR bus after the row and bank addresses, and the address register 302 applies the column address to a column address counter and latch 314 which, in turn, latches the column address and applies the latched column address to a plurality of column decoders 316A–D. The bank control logic 306 activates the column decoder 316A–D corresponding to the received bank address, and the activated column decoder decodes the applied column address. Depending on the operating mode of the memory device 300, the column address counter and latch 314 either directly applies the latched column address to the decoders 316A–D, or applies a sequence of column addresses to the decoders starting at the column address provided by the address register 302. In response to the column address from the counter and latch 314, the activated column decoder 316A–D applies decode and control signals to an I/O gating and data masking circuit 318 which, in turn, accesses memory cells corresponding to the decoded column address in the activated row of memory cells in the memory bank 312A–D being accessed.

During data read operations, data being read from the addressed memory cells is coupled through the I/O gating and data masking circuit 318 to a read latch 320. The I/O gating and data masking circuit 318 supplies N bits of data to the read latch 320, which then applies two N/2 bit words to a multiplexer 322. In the embodiment of FIG. 3, the circuit 318 provides 64 bits to the read latch 320 which, in turn, provides two 32 bits words to the multiplexer 322. A data driver 324 sequentially receives the N/2 bit words from the multiplexer 322 and also receives a data strobe signal DQS from a strobe signal generator 326 and the delayed clock signal CLKDEL from the delay-locked loop 200. The DQS signal is used by an external circuit such as a memory controller (not shown) in latching data from the memory device 300 during read operations. In response to the delayed clock signal CLKDEL, the data driver 324 sequentially outputs the received N/2 bits words as a corresponding data word DQ, each data word being output in synchronism with a rising or falling edge of a CLK signal that is applied to clock the memory device 300. The data driver 324 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the delay-locked loop 200 is a delayed version of the CLK signal, and the delay-locked loop adjusts the delay of the CLKDEL signal relative to the CLK signal to ensure that the DQS signal and the DQ words are placed on the DATA bus in synchronism with the CLK signal. Thus, the delay-locked loop 200 applies the CLKDEL signal to clock the drivers 324 at the proper time to ensure the CLK and DQS signal and DQ words are synchronized. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus DATA. A data receiver 328 receives each DQ word and the associated DM0-X signals, and applies these signals to input registers 330 that are clocked by the DQS signal. In response to a rising edge of the DQS signal, the input registers 330 latch a first N/2 bit DQ word and the associated DM0-X signals, and in response to a falling edge of the DQS signal the input registers latch the second N/2 bit DQ word and associated DM0-X signals. The input register 330 provides the two latched N/2 bit DQ words as an N-bit word to a write FIFO and driver 332, which clocks the applied DQ word and DM0-X signals into the write FIFO and driver in response to the DQS signal. The DQ word is clocked out of the write FIFO and driver 332 in response to the CLK signal, and is applied to the I/O gating and masking circuit 318. The I/O gating and masking circuit 318 transfers the DQ word to the addressed memory cells in the accessed bank 312A–D subject to the DM0-X signals, which may be used to selectively mask bits or groups of bits in the DQ words (i.e., in the write data) being written to the addressed memory cells.

A control logic and command decoder 334 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 334 latches and decodes an applied command, and generates a sequence of clocking and control signals that control the components 302–332 to execute the function of the applied command. The clock enable signal CKE enables clocking of the command decoder 334 by the clock signals CLK, CLK*. The command decoder 334 latches command and address signals at positive edges of the CLK, CLK* signals (i.e., the crossing point of CLK going high and CLK* going low), while the input registers 330 and data drivers 324 transfer data into and from, respectively, the memory device 300 in response to both edges of the data strobe signal DQS and thus at double the frequency of the clock signals CLK, CLK*. This is true because the DQS signal has the same frequency as the CLK, CLK* signals. The memory device 300 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 334 in generating the control and timing signals is conventional, and thus, for the sake of brevity, will not be described in more detail.

Figure 4:
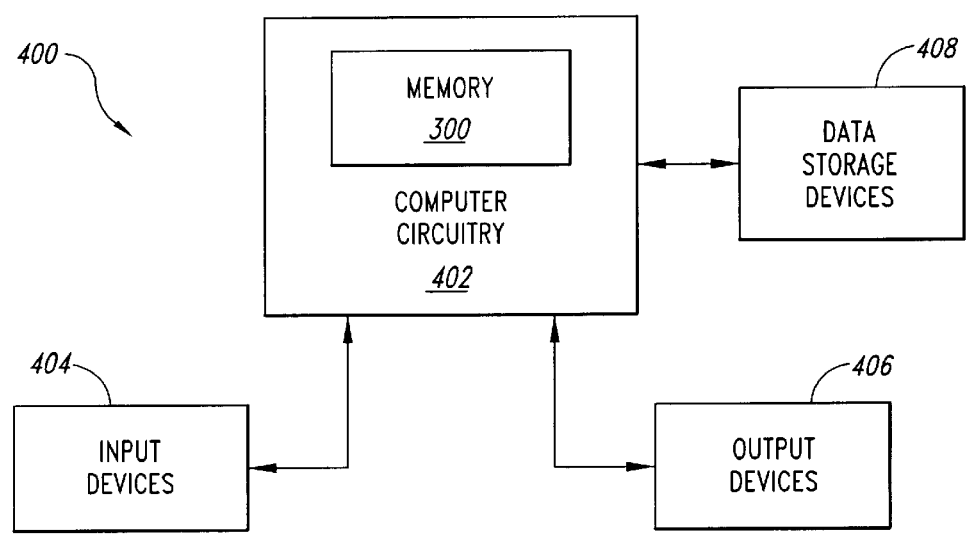
FIG. 4 is a functional block diagram of a computer system including the memory device of FIG. 3.

FIG. 4 is a block diagram of a computer system 400 including computer circuitry 402 including the memory device 300 of FIG. 3. Typically, the computer circuitry 402 is coupled through address, data, and control buses to the memory device 300 to provide for writing data to and reading data from the memory device. The computer circuitry 402 includes circuitry for performing various computing functions, such as executing specific software to perform specific calculations or tasks. In addition, the computer system 400 includes one or more input devices 404, such as a keyboard or a mouse, coupled to the computer circuitry 402 to allow an operator to interface with the computer system. Typically, the computer system 400 also includes one or more output devices 406 coupled to the computer circuitry 402, such as output devices typically including a printer and a video terminal. One or more data storage devices 408 are also typically coupled to the computer circuitry 402 to store data or retrieve data from external storage media (not shown). Examples of typical storage devices 408 include hard and floppy disks, tape cassettes, compact disk read-only (CD-ROMs) and compact disk read write (CD-RW) memories, and digital video disks (DVDs).

One skilled in the art will understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A synchronization circuit, comprising:
 a first phase-shifting path circuit adapted to receive an input signal and operable to generate a first phase-shifted signal responsive to the input signal, the first phase-shifted signal having a fine phase shift and a coarse phase shift relative to the input signal, and the first phase-shifting path circuit operable to adjust the coarse and fine phase shifts responsive to coarse and fine control signals, respectively;

a second phase-shifting path circuit adapted to receive the input signal and operable to generate a second phase-shifted signal responsive to the input signal, the second phase-shifted signal having a fine phase shift and a coarse phase shift relative to the input signal, and the second phase-shifting path circuit operable to adjust the coarse and fine phase shifts responsive to the coarse and fine control signals, respectively;

a selection circuit coupled to the first and second phase-shifting path circuits and operable to select one of the first and second phase-shifted signals responsive to a selection signal and to apply the selected signal on an output; and a control circuit adapted to receive the input signal and coupled to the first and second phase-shifting path circuits and the selection circuit, the control circuit operable to develop the selection signal to select one of the first and second phase-shifted signals and operable responsive to a phase shift between the input signal and the selected phase-shifted signal to apply the fine control signals to adjust the fine phase shift of the phase-shifting path circuit generating the selected phase-shifted signal and operable to apply the fine and coarse control signals to adjust the fine and coarse phase shifts of the other phase-shifting path circuit, and operable responsive to the fine delay of the phase-shifting path circuit that is generating the selected phase-shifted signal having a threshold value to develop the selection signal to select the other one of the phase-shifted signals.

2. The synchronization circuit of claim 1 wherein the control circuit is further operable to apply the selection signal to select the other one of the phase-shifted signals when the fine delay of the phase-shifting path circuit that is generating the selected phase-shifted signal has a minimum phase shift value or a maximum phase shift value.

3. The synchronization circuit of claim 1 wherein the fine and coarse phase shifts of the first phase-shifting path circuit are designated FP1 and CP1, respectively, and the fine and coarse phase shifts of the second phase-shifting path circuit are designated FP2 and CP2, respectively, and wherein the control circuit develops the fine and coarse control signals to adjust the fine and coarse phase shifts of the first and second phase-shifting path circuits until FP1+CP1 is approximately equal to FP2+CP2.

4. The synchronization circuit of claim 1 wherein the synchronization circuit comprises a delay-locked loop.

5. The synchronization circuit of claim 4 wherein each of the first and second phase shifting path circuits comprises:

a fine delay line and control circuit coupled to receive the input signal and generating a fine delayed signal responsive to the input signal, the fine delayed signal having a fine delay relative to the input signal and the fine delay line and control circuit adjusting the fine delay responsive to the fine control signals; and a coarse delay line and control circuit coupled to the fine delay line and control circuit and generating the phase-shifted signal responsive to the fine delayed signal, the phase-shifted signal having a coarse delay relative to the fine delayed signal and the coarse delay line and control circuit adjusting the coarse delay responsive to the coarse control signals.

6. The synchronization circuit of claim 4 wherein the control circuit comprises:

a feedback delay line coupled to the output of the selection circuit and operable to develop a delayed feedback clock signal responsive to the selected phase-shifted signal from the selection circuit;

a phase detector adapted to receive input signal and coupled to the feedback delay line to receive the feedback clock signal, the phase detector developing coarse and fine adjustment signals responsive to the phase difference between input and feedback clock signals;

an initialization control logic circuit coupled to the phase detector and operable to develop coarse and fine control signals responsive to the adjustment signals during an initialization mode of operation; and a fine adjustment control logic circuit coupled to the phase detector to receive the fine adjustment signals, and operable to develop control signals to adjust the fine phase shift of the phase-shifting path circuit generating the selected phase-shifted signal and the fine and coarse phase shifts of the other path circuit during a normal mode operation.

7. The synchronization circuit of claim 6 further comprising a base coarse variable delay line adapted to receive an external signal and coupled to the first and second phase-shifting path circuits and to the initialization control logic circuit, the base coarse variable delay line operable to generate the input signal responsive to the external signal, the input signal having a coarse delay relative to the input signal, and the base coarse variable delay line operable to adjust the coarse delay responsive to coarse control signals from the initialization control logic circuit.

8. The synchronization circuit of claim 1 wherein the selection circuit comprises a multiplexer.

9. The synchronization circuit of claim 1 wherein the input signal comprises a clock signal.

10. The synchronization circuit of claim 1 wherein the control circuit is further operable to adjust the fine phase shifts of the first and second phase-shifting path circuits responsive to a phase shift between the first and second phase-shifted signals.

11. A synchronization circuit, comprising:

a first phase-shifting means for generating a first phase-shifted signal responsive to an input signal, the first phase-shifted signal having a fine phase shift and a coarse phase shift relative to the input signal, and the phase shifts being adjustable;

a second phase-shifting means for generating a second phase-shifted signal responsive to the input signal, the second phase-shifted signal having the fine phase shift and the coarse phase shift relative to the input signal, and the phase shifts being adjustable; and means for adjusting the fine phase shift of a selected one of the phase-shifted signals and adjusting the fine and coarse phase shifts of the other phase-shifted signal responsive to a phase shift between the input signal and the selected phase-shifted signal, and for selecting the other one of the phase-shifted signals responsive to the fine delay of the selected phase-shifted signal having a threshold value.

12. The synchronization circuit of claim 11 wherein the means for adjusting selects the other one of the phase-shifted signals when the fine delay of the selected phase-shifted signal has a minimum phase shift value or a maximum phase shift value.

13. The synchronization circuit of claim 11 wherein the fine and coarse phase shifts of the first phase-shifting means are designated FP1 and CP1, respectively, and the fine and coarse phase shifts of the second phase-shifting means are designated FP2 and CP2, respectively, and wherein the means for adjusting adjusts the fine phase shift of the selected phase-shifted signal and the coarse and fine phase shifts of the other phase-shifted signal until FP1+CP1 is approximately equal to FP2+CP2.

14. The synchronization circuit of claim 11 wherein the synchronization circuit comprises a delay-locked loop.

15. The synchronization circuit of claim 14 wherein each of the first and second phase-shifting means further comprises:
   a fine delay means for generating a fine delayed signal responsive to the input signal, the fine delayed signal having a fine delay relative to the input signal, and the fine delay being adjustable; and
   a coarse delay means for generating the phase-shifted signal responsive to the fine delayed signal, the phase-shifted signal having a coarse delay relative to the fine delayed signal and the coarse delay being adjustable.

16. The synchronization circuit of claim 14 wherein the means for adjusting comprises:
   a feedback delay means for developing a delayed feedback clock signal responsive to the selected phase-shifted signal;
   a phase detection means for generating phase signals indicating fine and coarse phase differences between the input and feedback clock signals;
   an initialization means for adjusting the coarse and fine phase shifts of the phase-shifted signals responsive to the phase signals during an initialization mode of operation; and
   a fine adjustment control means for adjusting the fine phase shift of the selected phase-shifted signal and the fine and coarse phase shifts of the other phase-shifted signal during a normal mode.

17. The synchronization circuit of claim 16 further comprising a base delay means for generating the input signal responsive to an external signal, the input signal having a coarse delay relative to the input signal, and the initialization means adjusting the coarse delay.

18. The synchronization circuit of claim 11 wherein the input signal comprises a clock signal.

19. The synchronization circuit of claim 11 wherein the means for adjusting further adjusts the fine phase shifts of the first and second phase-shifting means responsive to a phase shift between the first and second phase-shifted signals.

20. A delay-locked loop, comprising:
   an input buffer;
   a base coarse variable delay line coupled to the input buffer;
   a first delay path, including,
      a first fine delay line and control circuit coupled to the base coarse variable delay line;
      a first coarse delay line and control circuit coupled to the first fine delay line and control circuit;
   a second delay path, including,
      a second fine delay line and control circuit coupled to the base coarse variable delay line;
      a second coarse delay line and control circuit coupled to the second fine delay line and control circuit;
   a multiplexer coupled to the coarse delay line and control circuits;
   an output buffer coupled to the multiplexer;
   a feedback delay line coupled to the multiplexer;
   a phase detector coupled to the input buffer and the feedback delay line;
   an initialization and control logic circuit coupled to the base coarse variable delay line, the phase detector, and the fine delay line and control circuits;
   a fine adjustment control logic circuit coupled to the fine and coarse delay line and control circuits and coupled to the multiplexer and the phase detector.

21. The delay-locked loop of claim 20 further comprising a fine phase detector coupled to the fine adjustment control logic circuit and the first and second coarse delay line and control circuits.

22. A memory device, comprising:
   an address bus;
   a control bus;
   a data bus;
   an address decoder coupled to the address bus;
   a read/write circuit coupled to the data bus;
   a control circuit coupled to the control bus;
   a memory-cell array coupled to the address decoder, control circuit, and read/write circuit; and
   a synchronization circuit coupled to the read/write circuit, the synchronization circuit including:
      a first phase-shifting path circuit adapted to receive an input clock signal and operable to generate a first phase-shifted clock signal responsive to the input clock signal, the first phase-shifted clock signal having a fine phase shift and a coarse phase shift relative to the input clock signal, and the first phase-shifting path circuit operable to adjust the coarse and fine phase shifts responsive to coarse and fine control signals, respectively;
      a second phase-shifting path circuit adapted to receive the input clock signal and operable to generate a second phase-shifted clock signal responsive to the input clock signal, the second phase-shifted clock signal having a fine phase shift and a coarse phase shift relative to the input clock signal, and the second phase-shifting path circuit operable to adjust the coarse and fine phase shifts responsive to the coarse and fine control signals, respectively;
      a selection circuit coupled to the first and second phase-shifting path circuits and operable to select one of the first and second phase-shifted clock signals responsive to a selection signal and to apply the selected signal on an output; and
      a control circuit adapted to receive the input clock signal and coupled to the first and second phase-shifting path circuits and the selection circuit, the control circuit operable to develop the selection signal to select one of the first and second phase-shifted clock signals and operable responsive to a phase shift between the input clock signal and the selected phase-shifted clock signal to apply the fine control signals to adjust the fine phase shift of the phase-shifting path circuit generating the selected phase-shifted clock signal and operable to apply the fine and coarse control signals to adjust the fine and coarse phase shifts of the other phase-shifting path circuit, and operable responsive to the fine delay of the phase-shifting path circuit that is generating the selected phase-shifted clock signal having a threshold value to develop the selection signal to select the other one of the phase-shifted clock signals.

23. The memory device of claim 22 wherein the memory device comprises a DRAM.

24. The memory device of claim 22 wherein the control circuit is further operable to apply the selection signal to select the other one of the phase-shifted clock signals when the fine delay of the phase-shifting path circuit that is generating the selected phase-shifted clock signal has a minimum phase shift value or a maximum phase shift value.

25. The memory device of claim 22 wherein the fine and coarse phase shifts of the first phase-shifting path circuit are designated FP1 and CP1, respectively, and the fine and coarse phase shifts of the second phase-shifting path circuit are designated FP2 and CP2, respectively, and wherein the control circuit develops the fine and coarse control signals to adjust the fine and coarse phase shifts of the first and second phase-shifting path circuits until FP1+CP1 is approximately equal to FP2+CP2.

26. The memory device of claim 22 wherein the synchronization circuit comprises a delay-locked loop.

27. The memory device of claim 26 wherein each of the first and second phase shifting path circuits comprises:
   a fine delay line and control circuit coupled to receive the input clock signal and generating a fine delayed signal responsive to the input clock signal, the fine delayed signal having a fine delay relative to the input clock signal and the fine delay line and control circuit adjusting the fine delay responsive to the fine control signals; and
   a coarse delay line and control circuit coupled to the fine delay line and control circuit and generating the phase-shifted clock signal responsive to the fine delayed signal, the phase-shifted clock signal having a coarse delay relative to the fine delayed signal and the coarse delay line and control circuit adjusting the coarse delay responsive to the coarse control signals.

28. The memory device of claim 26 wherein the control circuit comprises:
   a feedback delay line coupled to the output of the selection circuit and operable to develop a delayed feedback clock signal responsive to the selected phase-shifted clock signal from the selection circuit;
   a phase detector adapted to receive input clock signal and coupled to the feedback delay line to receive the feedback clock signal, the phase detector developing coarse and fine adjustment signals responsive to the phase difference between input and feedback clock signals;
   an initialization control logic circuit coupled to the phase detector and operable to develop coarse and fine control signals responsive to the adjustment signals during an initialization mode of operation; and
   a fine adjustment control logic circuit coupled to the phase detector to receive the fine adjustment signals, and operable to develop control signals to adjust the fine phase shift of the phase-shifting path circuit generating the selected phase-shifted clock signal and the fine and coarse phase shifts of the other path circuit during a normal mode operation.

29. The memory device of claim 28 further comprising a base coarse variable delay line adapted to receive an external signal and coupled to the first and second phase-shifting path circuits and to the initialization control logic circuit, the base coarse variable delay line operable to generate the input clock signal responsive to the external signal, the input clock signal having a coarse delay relative to the input clock signal, and the base coarse variable delay line operable to adjust the coarse delay responsive to coarse control signals from the initialization control logic circuit.

30. The memory device of claim 22 wherein the control circuit is further operable to adjust the fine phase shifts of the first and second phase-shifting path circuits responsive to a phase shift between the first and second phase-shifted signals.

31. A computer system, comprising:
   a data input device;
   a data output device;
   a processor coupled to the data input and output devices; and
   a memory device coupled to the processor, the memory device comprising:
      an address bus;
      a control bus;
      a data bus;
      an address decoder coupled to the address bus;
      a read/write circuit coupled to the data bus;
      a control circuit coupled to the control bus;
      a memory-cell array coupled to the address decoder, control circuit, and read/write circuit; and
      a synchronization circuit coupled to the read/write circuit, the synchronization circuit including:
         a first phase-shifting path circuit adapted to receive an input clock signal and operable to generate a first phase-shifted clock signal responsive to the input clock signal, the first phase-shifted clock signal having a fine phase shift and a coarse phase shift relative to the input clock signal, and the first phase-shifting path circuit operable to adjust the coarse and fine phase shifts responsive to coarse and fine control signals, respectively;
         a second phase-shifting path circuit adapted to receive the input clock signal and operable to generate a second phase-shifted clock signal responsive to the input clock signal, the second phase-shifted clock signal having a fine phase shift and a coarse phase shift relative to the input clock signal, and the second phase-shifting path circuit operable to adjust the coarse and fine phase shifts responsive to the coarse and fine control signals, respectively;
         a selection circuit coupled to the first and second phase-shifting path circuits and operable to select one of the first and second phase-shifted clock signals responsive to a selection signal and to apply the selected signal on an output; and
         a control circuit adapted to receive the input clock signal and coupled to the first and second phase-shifting path circuits and the selection circuit, the control circuit operable to develop the selection signal to select one of the first and second phase-shifted clock signals and operable responsive to a phase shift between the input clock signal and the selected phase-shifted clock signal to apply the fine control signals to adjust the fine phase shift of the phase-shifting path circuit generating the selected phase-shifted clock signal and operable to apply the fine and coarse control signals to adjust the fine and coarse phase shifts of the other phase-shifting path circuit, and operable responsive to the fine delay of the phase-shifting path circuit that is generating the selected phase-shifted clock signal having a threshold value to develop the selection signal to select the other one of the phase-shifted clock signals.

32. The computer system of claim 31 wherein the memory device comprises a DRAM.

33. The computer system of claim 31 wherein the control circuit is further operable to apply the selection signal to select the other one of the phase-shifted clock signals when the fine delay of the phase-shifting path circuit that is generating the selected phase-shifted clock signal has a minimum phase shift value or a maximum phase shift value.

34. The computer system of claim 31 wherein the synchronization circuit comprises a delay-locked loop.

35. The memory device of claim 34 wherein each of the first and second phase shifting path circuits comprises:

a fine delay line and control circuit coupled to receive the input clock signal and generating a fine delayed signal responsive to the input clock signal, the fine delayed signal having a fine delay relative to the input clock signal and the fine delay line and control circuit adjusting the fine delay responsive to the fine control signals; and a coarse delay line and control circuit coupled to the fine delay line and control circuit and generating the phase-shifted clock signal responsive to the fine delayed signal, the phase-shifted clock signal having a coarse delay relative to the fine delayed signal and the coarse delay line and control circuit adjusting the coarse delay responsive to the coarse control signals.

36. The memory device of claim 34 wherein the control circuit comprises:

a feedback delay line coupled to the output of the selection circuit and operable to develop a delayed feedback clock signal responsive to the selected phase-shifted clock signal from the selection circuit;

a phase detector adapted to receive input clock signal and coupled to the feedback delay line to receive the feedback clock signal, the phase detector developing coarse and fine adjustment signals responsive to the phase difference between input and feedback clock signals;

an initialization control logic circuit coupled to the phase detector and operable to develop coarse and fine control signals responsive to the adjustment signals during an initialization mode of operation; and a fine adjustment control logic circuit coupled to the phase detector to receive the fine adjustment signals, and operable to develop control signals to adjust the fine phase shift of the phase-shifting path circuit generating the selected phase-shifted clock signal and the fine and coarse phase shifts of the other path circuit during a normal mode operation.

37. The memory device of claim 36 further comprising a base coarse variable delay line adapted to receive an external signal and coupled to the first and second phase-shifting path circuits and to the initialization control logic circuit, the base coarse variable delay line operable to generate the input clock signal responsive to the external signal, the input clock signal having a coarse delay relative to the input clock signal, and the base coarse variable delay line operable to adjust the coarse delay responsive to coarse control signals from the initialization control logic circuit.

38. A method of generating an-output clock signal having a phase shift relative to an input clock signal, the method comprising:

applying the input clock signal through a first phase-shifting path to generate a first phase-shifted clock signal, the first phase-shifted clock signal having a phase shift equal to the sum of a coarse phase shift and a fine phase shift;

applying the input clock signal through a second phase-shifting path to generate a second phase-shifted clock signal, the second phase-shifted clock signal having a phase shift equal to the sum of the coarse phase shift and the fine phase shift;

selecting one of the first and second phase-shifting paths as an active phase-shifting path and the other one of the phase-shifting paths as a background phase-shifting path;

providing the phase-shifted clock signal from the active phase-shifting path as the output clock signal;

detecting a phase shift between the input and output clock signals;

adjusting a value of the fine phase shift introduced by the active phase-shifting path responsive to the detected phase shift;

adjusting values of the coarse and fine phase shifts introduced by the background phase-shifting path responsive to the detected phase shift;

responsive to the adjusted value of the fine phase shift of the active phase-shifting path reaching a threshold value, selecting the background phase-shifting path as the active phase-shifting path and the other one of the phase-shifting paths as the background phase-shifting path; and providing the phase-shifted clock signal from the active phase-shifting path as the output clock signal.

39. The method of claim 38 wherein the phase shift of the output clock signal relative to the input clock signal comprises a delay of the output clock signal relative to the input clock signal.

40. The method of claim 38 wherein the background phase-shifting path is selected as the active phase-shifting path responsive to the fine phase shift of the active phase-shifting path having a minimum or a maximum threshold value.

41. The method of claim 38 wherein a range of values of the fine phase shift in at least one of the phase-shifting paths has a value greater than a unit coarse delay value, with values of the coarse delays in the first and second phase-shifting paths being respective integer multiples of the unit coarse delay.

42. The method of claim 41 wherein a range of the coarse delay in the first phase-shifting path does not equal a range of the coarse delay in the second phase shifting path.

43. The method of claim 38 wherein the input clock signal comprises a system clock signal CLK.

44. The method of claim 38 further comprising adjusting the values of the fine phase shifts of the first and second phase-shifted clock signals responsive to a phase shift between the signals.

45. A method of generating an output clock signal having a phase shift relative to an input clock signal, the method comprising:

generating a plurality of phase-shifted clock signals responsive to the input clock signal, each phase shifted clock signal having a respective phase shift equal to the sum of a coarse phase shift and a fine phase shift;

selecting one of the phase-shifted clock signals and providing the selected clock signal as the output clock signal;

detecting a phase shift between the input and output clock signals;

adjusting the fine phase shift of the selected phase-shifted clock signal responsive to the detected phase shift;

adjusting respective coarse and fine phase shifts of the other phase-shifted clock signals responsive to the detected phase shift;

selecting a different one of the phase-shifted clock signals and providing this clock signal as the output clock signal responsive to the fine phase shift of the previously selected phase-shifted clock signal reaching a threshold value; and providing the different phase-shifted clock signal as the output signal.

46. The method of claim 45 wherein the phase shift of the output clock signal relative to the input clock signal comprises a delay of the output clock signal relative to the input clock signal.

47. The method of claim 45 wherein generating a plurality of phase-shifted clock signals comprises generating two phase-shifted clock signals.

48. The method of claim 47 wherein the selected one of the phase-shifted clock signals is designated the active phase-shifted clock signal and the other one of the phase-shifted clock signals is designated the background phase-shifted clock signal, and wherein the fine phase shift of the active phase-shifted clock signal is adjusted responsive to the detected phase shift and the coarse and fine phase shifts of the background phase-shifted clock signal are adjusted responsive to the detected phase shift.

49. The method of claim 48 wherein the background phase-shifted clock is selected as the active phase-shifted clock signal responsive to the fine phase shift of the active phase-shifted clock signal having a minimum or a maximum threshold value.

50. The method of claim 45 wherein generating a plurality of phase-shifted clock signals responsive to the input clock signal comprises generating the plurality of phase-shifted clocks signals in parallel.

51. The method of claim 45 wherein adjusting the fine phase shift of the selected phase-shifted clock signal and adjusting respective coarse and fine phase shifts of the other phase-shifted clock signals comprises adjusting the fine phase shift of the selected signal and the fine and coarse phase shifts of the other signals so that the fine phase shift plus the coarse phase shift of each signal is approximately equal.

52. The method of claim 45 wherein a range of values over which the fine phase shift of at least one of the phase-shifted clock signals has a value greater than a unit coarse delay value, with values of the coarse delays of the phase-shifted clock signals being respective integer multiples of the unit coarse delay.

53. The method of claim 52 wherein each coarse delay of the respective phase-shifted clock signals has a different range of values.

54. The method of claim 45 further comprising:

detecting a phase shift between the selected phase-shifted clock signal and at least one of the other phase-shifted clock signals; and adjusting the respective fine phase shifts of each other phase-shifted clock signal responsive to the detected phase shift between the selected phase-shifted clock signal and the other phase-shifted clock signal.

\* \* \* \* \*

UNITED STATES PATENT AND TRADEMARK OFFICE
CERTIFICATE OF CORRECTION

PATENT NO. : 6,836,166 B2
APPLICATION NO. : 10/339752
DATED : December 28, 2004
INVENTOR(S) : Feng Lin, Brent Keeth and Brian Johnson It is certified that error appears in the above-identified patent and that said Letters Patent is hereby corrected as shown below:

| Column, Line | Reads | Should Read |
|---|---|---|
| Title Page Item (57), Line 2 | "path circuit, with each generates a phase-shifted" | --path circuit, with each generating a phase-shifted-- |
| Column 1, Line 15 | "relative the rising" | --relative to the rising-- |
| Column 4, Line 1 | "operation responsive" | --operations responsive-- |
| Column 6, Line 26 | "CLKDEL signal signal." | --CLKDEL signal.-- |
| Column 6, Line 36 | "response to the a shift" | --response to the shift-- |
| Column 8, Line 1 | --activates MODE-- | --activates the MODE-- |
| Column 9, Line 29 | "a maximum fine delays" | --a maximum fine delay-- |
| Column 9, Line 49 | "to the delays paths" | --to the delay paths-- |
| Column 9, Lines 53-61 | "One skilled in the art will also realize that the term "delay" as used herein includes a delay of one signal relative to another as well as a lead in time of that one signal relative to the other signal, and thus may be viewed as a phase shift between the signals, which includes both a leading and lagging relationship between the signals includes | --One skilled in the art will also realize that the term "delay" as used herein includes a delay of one signal relative to another as well as a lead in time well as a lead in time of one signal relative to the other signal, and thus may be viewed as a phase shift between the signals. The phase shift includes both a |

UNITED STATES PATENT AND TRADEMARK OFFICE
CERTIFICATE OF CORRECTION

PATENT NO. : 6,836,166 B2  
APPLICATION NO. : 10/339752  
DATED : December 28, 2004  
INVENTOR(S) : Feng Lin, Brent Keeth and Brian Johnson It is certified that error appears in the above-identified patent and that said Letters Patent is hereby corrected as shown below:

| Column, Line | Reads | Should Read |
|---|---|---|
|  | a delay as the functions performed by the various blocks or components 202-228 forming the delay-locked loop 200 may be grouped differently than shown in FIG. 2." | leading and lagging relationship between the signals. The functions performed by the various blocks or components 202-228 forming the delay-locked loop 200 may be grouped differently than show in FIG. 2.-- |
| Column 11, Line 3 | "32 bits words" | --32 bit words-- |
| Column 11, Line 12 | "N/2 bits words" | --N/2 bit words-- |
| Column 12, Line 38 | "such as output devices" | --such output devices-- |
| Column 14, Line 3 | "to receive input signal" | --to receive an input signal-- |
| Column 17, Line 39 | "to receive input clock signal" | --to receive an input clock signal-- |
| Column 19, Line 30 | "to receive input clock signal" | --to receive an input clock signal-- |

UNITED STATES PATENT AND TRADEMARK OFFICE
CERTIFICATE OF CORRECTION

PATENT NO. : 6,836,166 B2
APPLICATION NO. : 10/339752
DATED : December 28, 2004
INVENTOR(S) : Feng Lin, Brent Keeth and Brian Johnson It is certified that error appears in the above-identified patent and that said Letters Patent is hereby corrected as shown below:

| Column, Line | Reads | Should Read |
|---|---|---|
| Column 19, Line 57 | "an-output clock signal" | --an output clock signal-- |

Signed and Sealed this

Twentieth Day of March, 2007

JON W. DUDAS
*Director of the United States Patent and Trademark Office*